United States Patent [19]

Kusuda

[11] Patent Number: 5,644,747
[45] Date of Patent: Jul. 1, 1997

[54] PAGE MODE ACCESS MEMORY CONTROLLER INCLUDING PLURAL ADDRESS LATCHES AND A COMPARATOR

[75] Inventor: Masahiro Kusuda, Tokyo, Japan

[73] Assignee: NEC Corporation, Tokyo, Japan

[21] Appl. No.: 398,442

[22] Filed: Mar. 3, 1995

[30] Foreign Application Priority Data

Mar. 8, 1994 [JP] Japan .................... 6-062139

[51] Int. Cl.⁶ .................... G06F 12/00; G11C 8/00
[52] U.S. Cl. .............. 395/405; 395/421.07; 395/421.01; 395/419; 395/494; 365/230.08; 365/230.02; 365/189.07
[58] Field of Search .................... 395/405, 481, 395/494, 419, 421.01, 421.07, 421.08; 365/233, 193, 230.02, 230.08, 238.5, 189.07

[56] References Cited

U.S. PATENT DOCUMENTS

| | | | |
|---|---|---|---|
| 4,870,622 | 9/1989 | Aria et al. | 365/238.5 |
| 4,933,910 | 6/1990 | Olson et al. | 365/233 |
| 5,034,917 | 7/1991 | Bland et al. | 395/494 |
| 5,269,010 | 12/1993 | MacDonald | 395/405 |
| 5,274,786 | 12/1993 | Diehl | 395/421.08 |
| 5,303,364 | 4/1994 | Mayer et al. | 395/467 |
| 5,305,277 | 4/1994 | Derwin et al. | 365/230.08 |
| 5,436,869 | 7/1995 | Yoshida | 365/230.08 |
| 5,522,064 | 5/1996 | Aldereguia et al. | 395/494 |

*Primary Examiner*—Glenn Gossage
*Attorney, Agent, or Firm*—Whitham, Curtis, Whitham & McGinn

[57] ABSTRACT

A memory controller for a computer system having a processor and dynamic random access memories (DRAMs) which are grouped into banks, and having multiple latches associated respectively with the groups of DRAMs. Each latch stores a row address from the processor in response to a row address strobe (RAS) signal when the corresponding memory bank is selected and one of the latches is selected corresponding to the selected memory bank. The row address stored in the selected latch is compared by a comparator with a row address from the processor. Initially, a controller accesses the DRAMs of a bank currently selected using a first row address from the processor. If the same row of the selected bank is addressed again, a coincidence is detected by the comparator, and in response, the controller accesses the DRAMs using the same row address and a column address from the processor. If a noncoincidence is detected by the comparator, the controller accesses the DRAMs of the currently selected bank using a second row address and a column address from the processor.

8 Claims, 11 Drawing Sheets

PAGE MODE ACCESS MEMORY CONTROLLER INCLUDING PLURAL ADDRESS LATCHES AND A COMPARATOR

BACKGROUND OF THE INVENTION

1. Field of the Invention

The present invention relates generally to computer systems, and more specifically to a memory controller for a computer system using a page mode access to DRAMs (dynamic random access memories) in which the memory access time (the precharge time of the row address plus the time to specify a row address) is reduced by repeatedly activating the column address strobe (CAS) line to successively specify column addresses while keeping the row address strobe line (RAS) active.

2. Description of the Related Art

According to conventional page mode access techniques used for accessing dynamic random access memories which are divided into a plurality of groups or banks, the banks are provided respectively with row address strobe (RAS) lines. However, the RAS line of each memory bank is independently activated to provide a page mode access exclusively to the memories of the associated bank when page hit occurs between successive accesses to the memories. However, because of the low degree of relationship between program addresses and data addresses, page hits occur less frequently if row accesses change from one bank to another.

SUMMARY OF THE INVENTION

It is therefore an object of the present invention to provide a page mode access memory controller for dynamic RAMs grouped into multiple banks, wherein the controller provides a high likelihood of page hit occurrences to achieve page mode access with a high average speed.

The object of the present invention is obtained by the provision of a plurality of latches associated respectively with groups of memories for storing a row address, a selector for selecting one of the latches corresponding to one of the memory groups which is currently selected by the processor, and a comparator for detecting a coincidence or noncoincidence between the row address stored in the selected latch and a row address from the processor. A controller is provided for accessing the memories of a group which is currently selected by the processor using a first row address and a column address from the processor. If a coincidence is detected by the comparator, the controller accesses the memories of the currently selected group using the same row address and a column address from the processor. If a noncoincidence is detected by the comparator, the controller accesses the memories of the currently selected group using a second row address and a column address from the processor.

More specifically, the controller activates the row access strobe (RAS) line of the DRAMs of the currently selected group and accesses the memories using a first row address. The controller is responsive to the coincidence detected by the comparator for activating the CAS line of one of the DRAMs of the currently selected group and accessing the memories using the same row address and a column address from the processor, and responsive to the noncoincidence for inactivating and then activating the RAS line of the currently selected group and activating the CAS line of one of the DRAMs of the currently selected group and accessing the memories using a second row address and a column address from the processor.

BRIEF DESCRIPTION OF THE DRAWINGS

The present invention will be described in further detail with reference to the accompanying drawings, in which.

DETAILED DESCRIPTION

Figure 1:
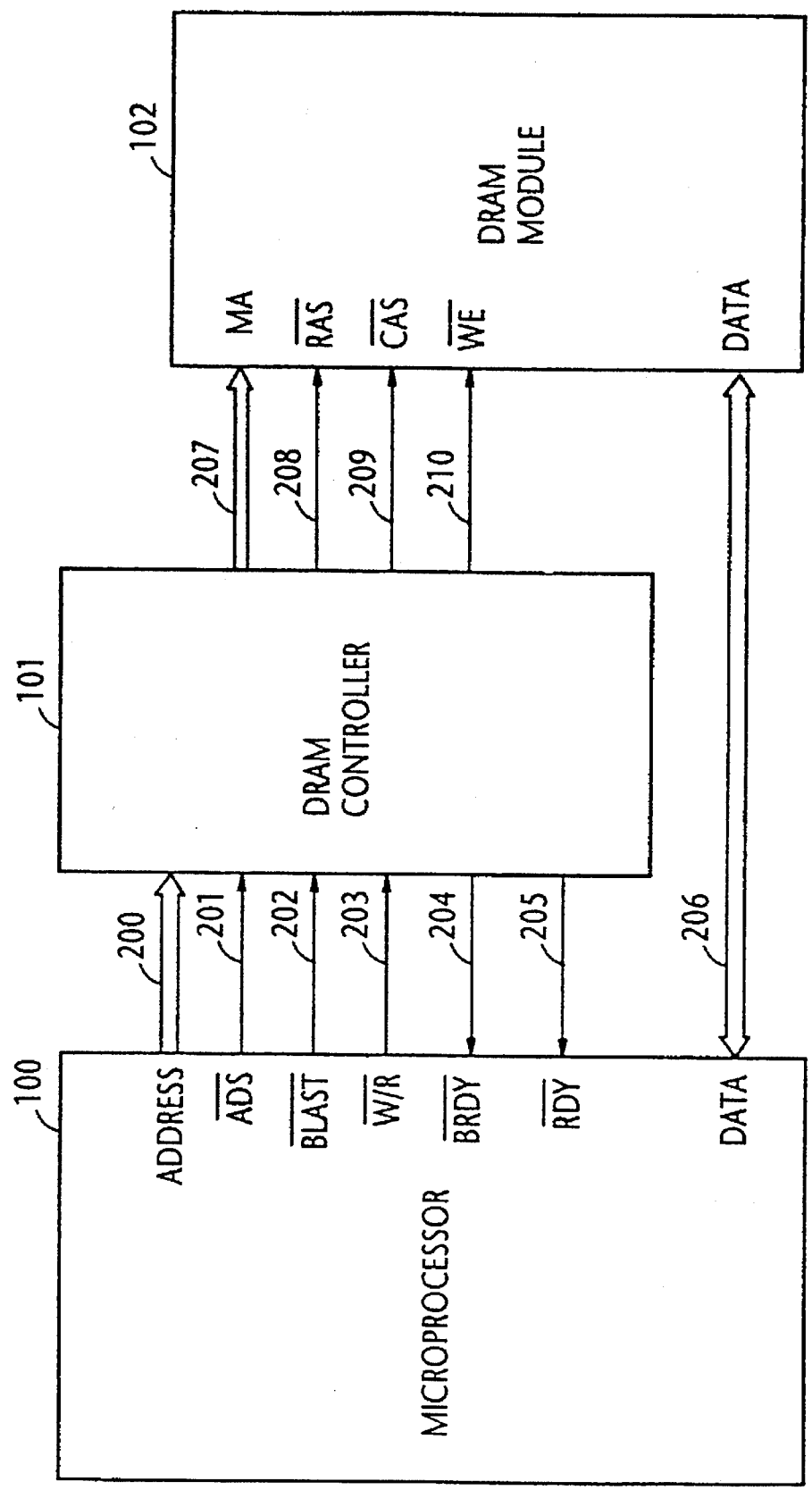
FIG. 1 is a block diagram of a prior art computer system.
Figure 2:
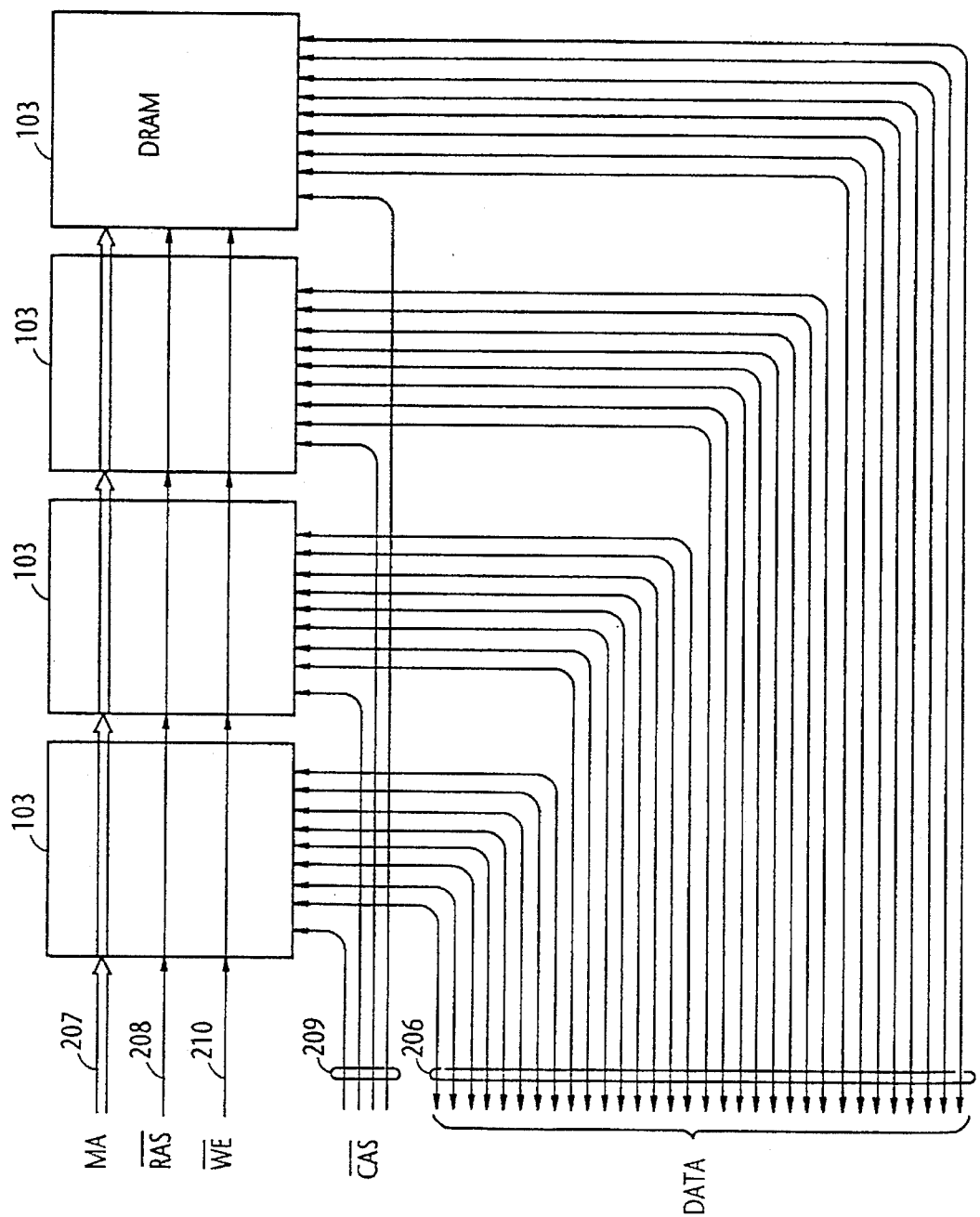
FIG. 2 is a block diagram of the DRAM module of the prior art computer system of FIG. 1.
Figure 3:
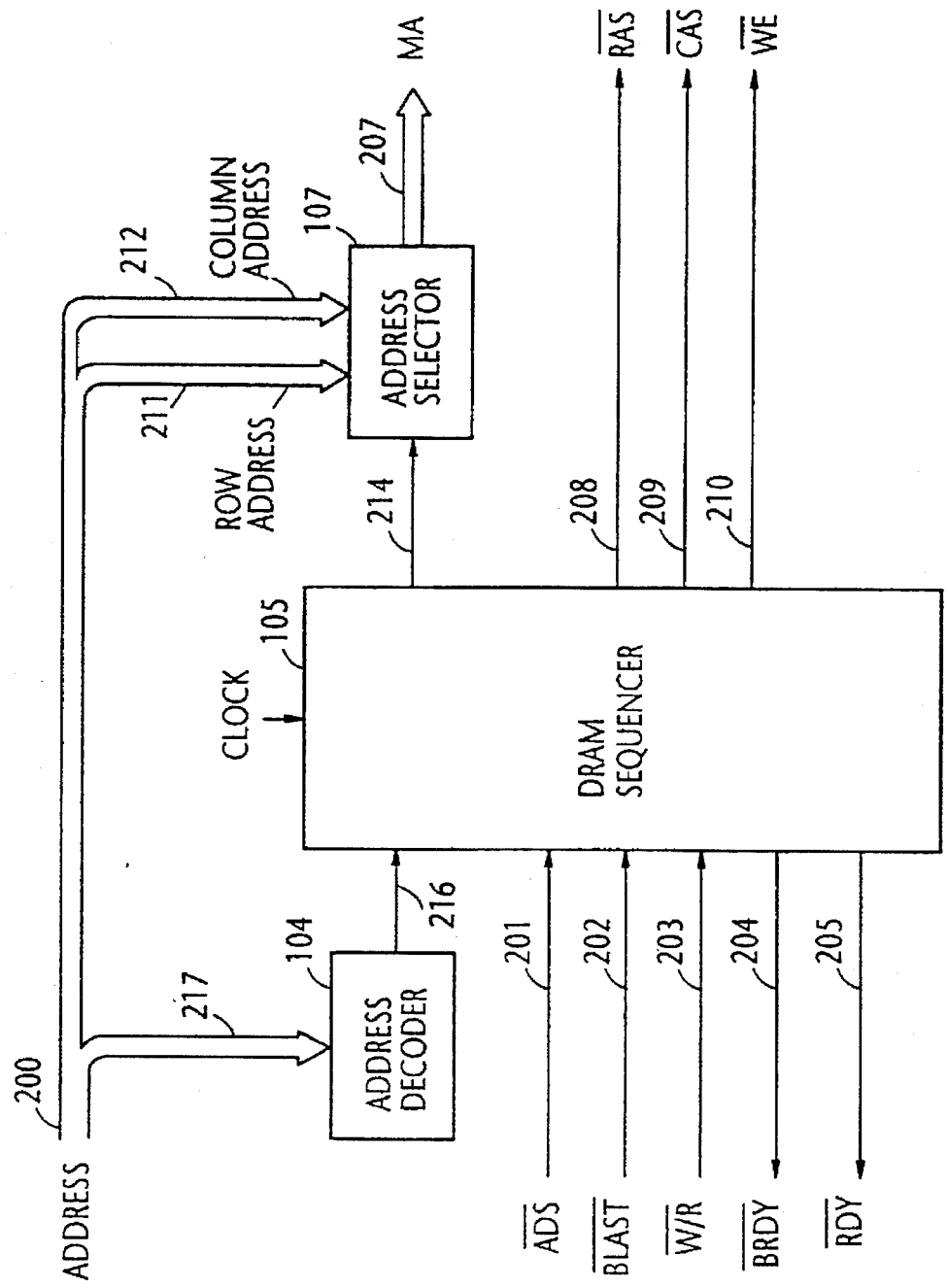
FIG. 3 is a block diagram of the DRAM controller of the prior art of FIG. 1.
Figure 4:
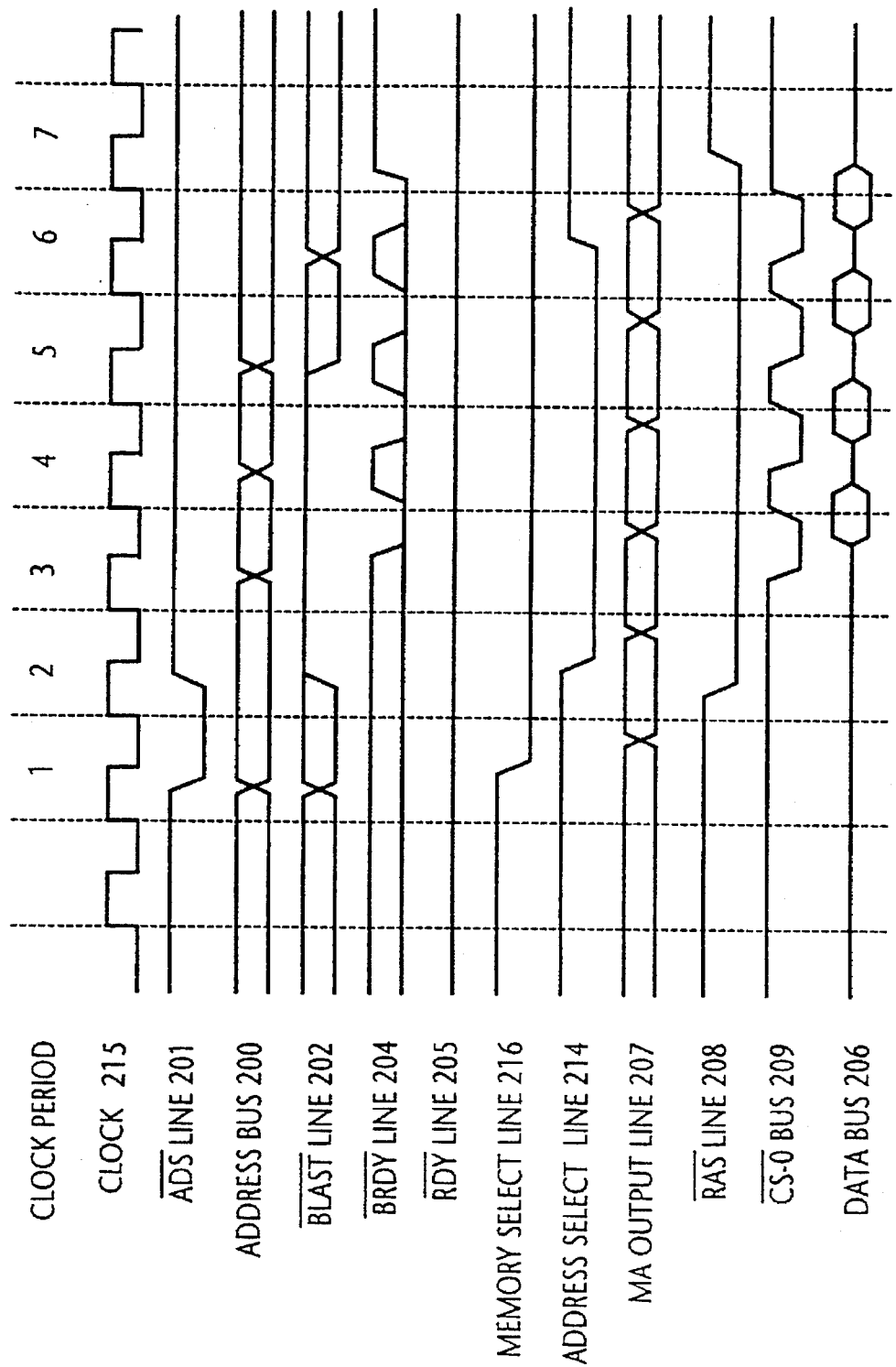
FIG. 4 is a timing diagram associated with the DRAM controller of FIG. 3.

Before going into details of the present invention, it would prove helpful to describe the prior art techniques with reference to FIGS. 1 to 6. In FIGS. 1 and 2, a prior art computer system using a page mode access DRAMs comprises a microprocessor 100 (such as Intel Corporation's (Santa Clara, Calif.) i80686), a DRAM controller 101 and a DRAM module 102. The i80686 processor 100 activates a burst bus cycle only when one-line of data is to be replaced when a cache miss occurs before it performs a data transfer over the 32-bit data bus. The bus cycle of the microprocessor 100 starts when the address start line ($\overline{ADS}$) 201 is made active low during period 1 defined by clock 215 (FIG. 4). In response, an address value is supplied on the address bus 200. The $\overline{W/R}$ line 203 indicates whether the bus cycle is in a read or write mode. Note that the following description is based on the assumption that the bus cycles are in a read mode. The $\overline{WE}$ line 210 is a active low write enable line which is inverse to the signal on the $\overline{W/R}$ line 203.

In FIG. 3, the DRAM controller includes a memory address decoder 104, a DRAM control sequencer 105 and a memory address selector 107. The address bus 200 is divided into a 9-bit memory select address bus 217, a 10-bit row address bus 211 and a 10-bit column address bus 212. Memory address decoder 104 is connected to the memory select address bus 217 to produce a memory select signal on line 216 which is coupled to the DRAM control sequencer 105 to indicate that an access to a DRAM space that is controlled by sequencer 105 has been initiated, starting an action for accessing the DRAM module 102. The access to the DRAM module 102 is carried out during periods 1 and 2 by selecting a row address on bus 211 through the selector 107 in response to a row select signal on lead 214 from the sequencer 105. This row address is applied on a bus 207 as a multiplexed address (MA) to the DRAM module 102 while activating the $\overline{RAS}$ line 208. During period 3, a column address on bus 212 is selected in response to a column select command and supplied to the DRAM module. At the end of period 3, a low-level burst transfer ready (BRDY) signal is generated by controller 101 and supplied on the BRDY line 204 to the microprocessor 100, indicating that it is ready for read data burst transfer and that the output data on data bus 206 from the DRAM module is valid. When this occurs, the non-burst data transfer ready (RDY) LINE 205 is set to high-inactive state. Thereafter, the CAS line 209 is low-activated at period intervals (FIG. 4) and the lower 2 bits of the address bus 200 are updated so that the column address on bus 212 (FIG. 3) is varied as illustrated during periods 4, 5 and 6. During period 5, a control signal on the BLAST LINE 202 is set low-active by the microprocessor 100 to inform the sequencer 105 of the fact that the current bus cycle is the replacement cycle for the last line of the cache memory, and hence there is no more burst bus cycle that follows. In response to the low level on the BLAST LINE 202, the DRAM sequencer 105 activates the CAS line 209 and the BRDY line 204 during period 6 and inactivates the RAS line 208 during period 7 to terminate the cache line replacement.

The disadvantage of this prior art is that the high-speed page mode access cannot be provided for other than cache replace cycles.

Figure 5:
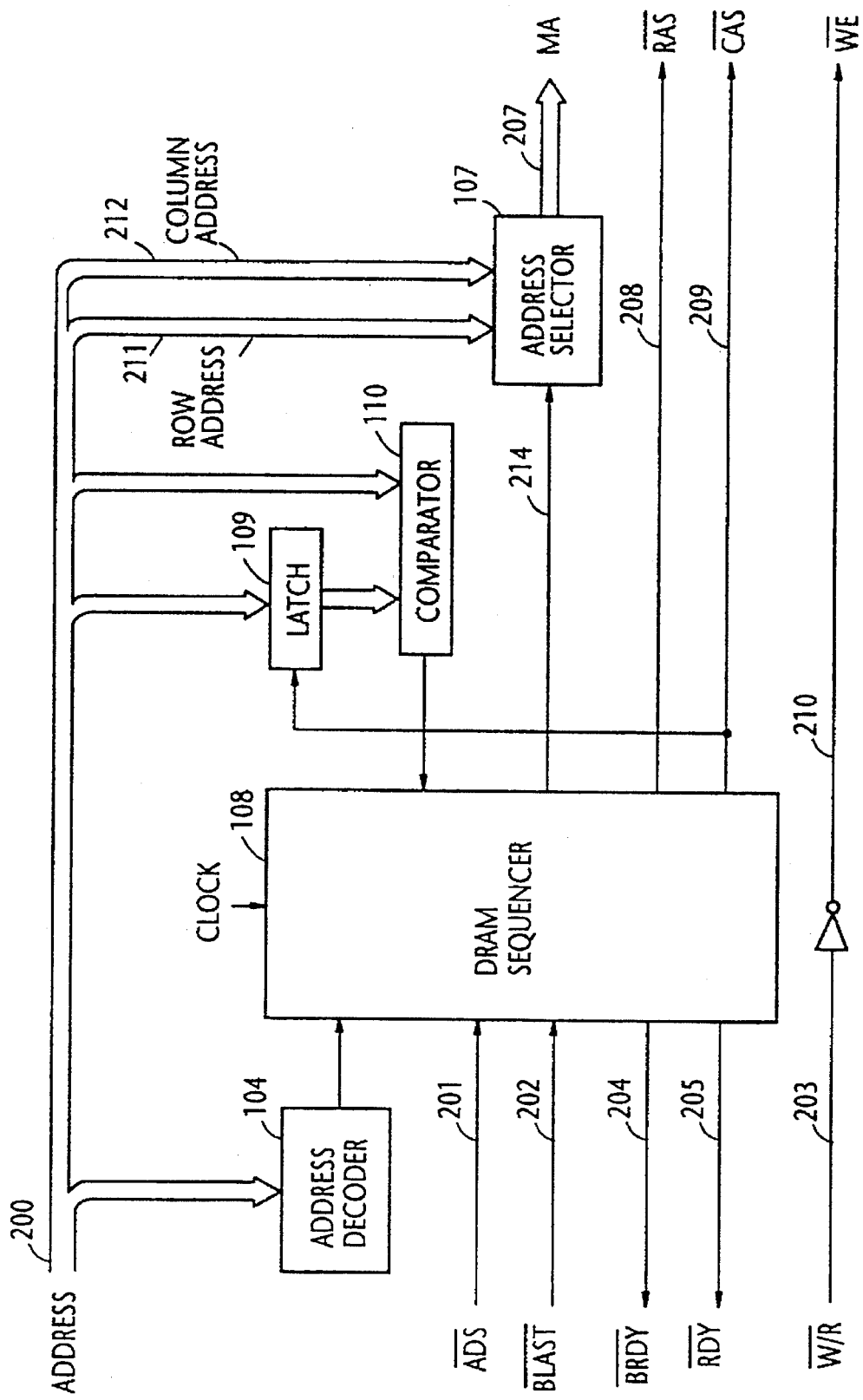
FIG. 5 is a block diagram of a DRAM controller of another prior art computer system.
Figure 6:
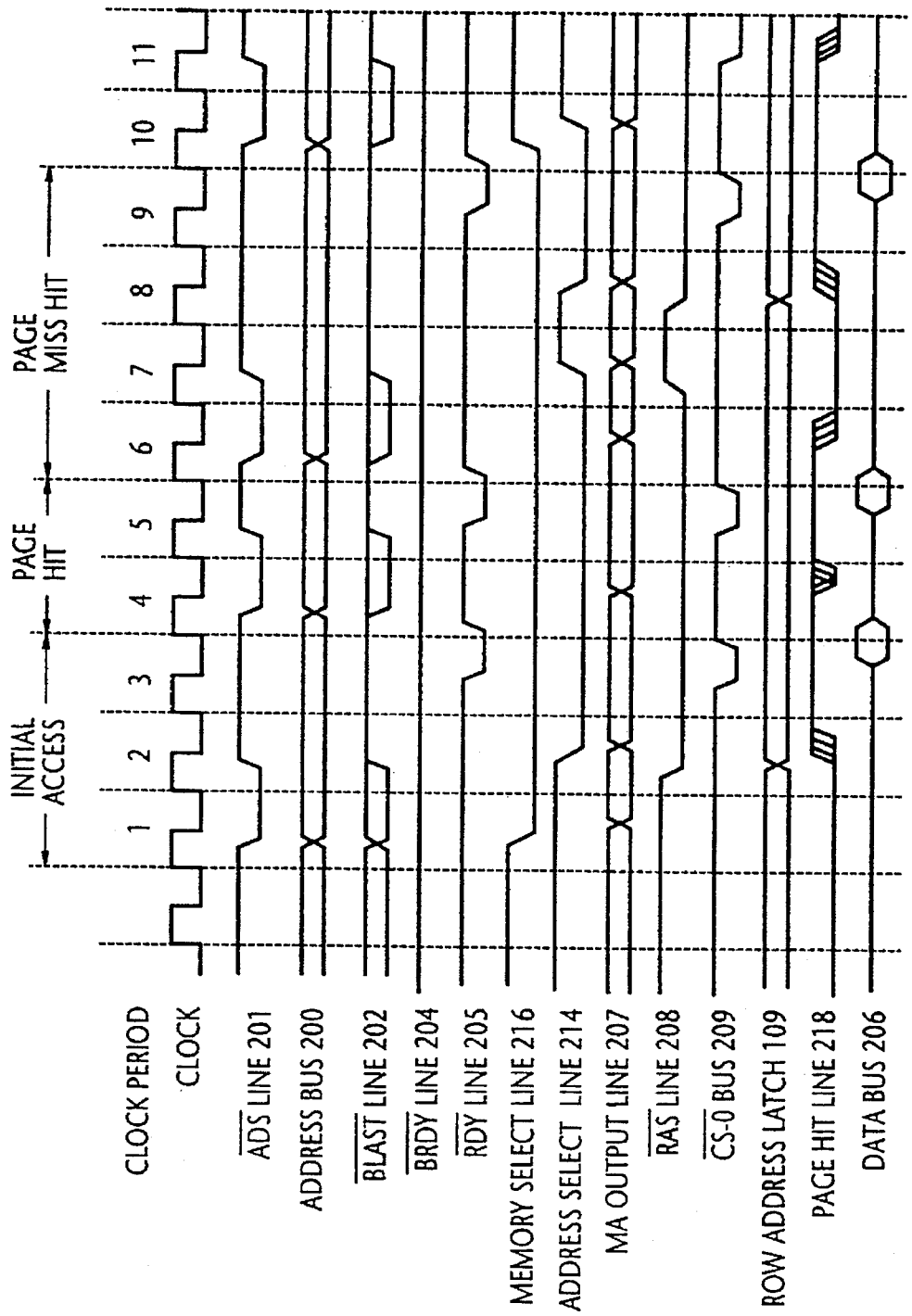
FIG. 6 is a timing diagram associated with the DRAM controller FIG. 5.

A second prior art DRAM controller shown in FIG. 5 makes uses of an address latch 109 and an address comparator 110 to eliminate the disadvantage of the first prior art technique. According to this technique, a row address is stored in the latch 109 as a reference value and a current row address value is compared with the reference value in the comparator 110 to detect a page hit or miss. High-speed page mode access is performed in response to the detection of a page hit. Initial access proceeds as shown in FIG. 6 during periods 1, 2 and 3. When the microprocessor 100 activates the ADS line 201 during period 1, it issues an address on bus 200. During periods 2 and 3, the RAS line 208 is active low. When one bus cycle terminates at the end of period 3, a new bus cycle begins (period 4). The row address on bus 211 is compared by comparator 110 with the output of latch 109 during period 4. If a page hit is detected, the DRAM sequencer 108 activates the CAS line 209 during period 5 to provide high speed page mode access. If bus cycles begin during period 6 and no page hit occurs, a page miss is detected by comparator 110 during period 7. The DRAM sequencer 108 is notified of the page miss and sets the RAS line 208 to high level and causes selector 107 to apply a row address to the DRAM module through bus 207. During period 8, the RAS line 208 is again set to a low level to supply a row address to the DRAM while storing it into the latch 109. At the end of period 8, a column address is applied through selector 107 to the DRAM module. During period 9, the CAS line 209 is activated to supply a column address to the DRAM module, terminating the access for the page miss event. Thus, the prior art technique requires three clock periods for the initial access, two clock periods for the page hit event and four clock periods for the miss event. In cases where a plurality of DRAM banks are provided, the RAS lines are generated respectively for the associated DRAM banks and each DRAM bank is selected by activating the associated RAS line.

However, the disadvantage of the second prior art technique is that, while high-speed page mode access is possible for page hit events, there is a low degree of correspondence between the locality of program addresses and that of data addresses. As a result, page hits are likely to occur less frequently than page misses.

Figure 7:
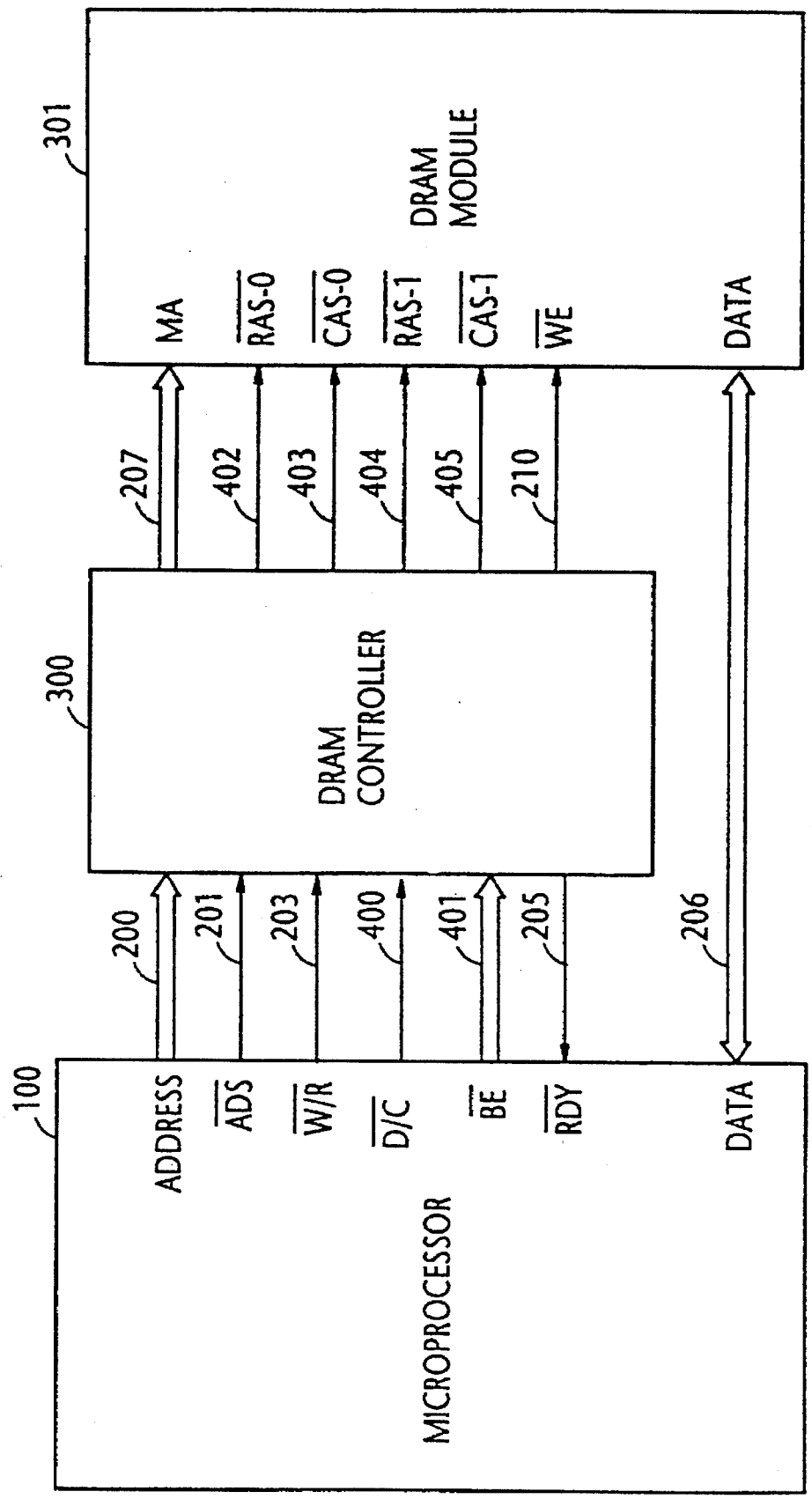
FIG. 7 is a block diagram of a computer system according to the present invention.
Figure 8:
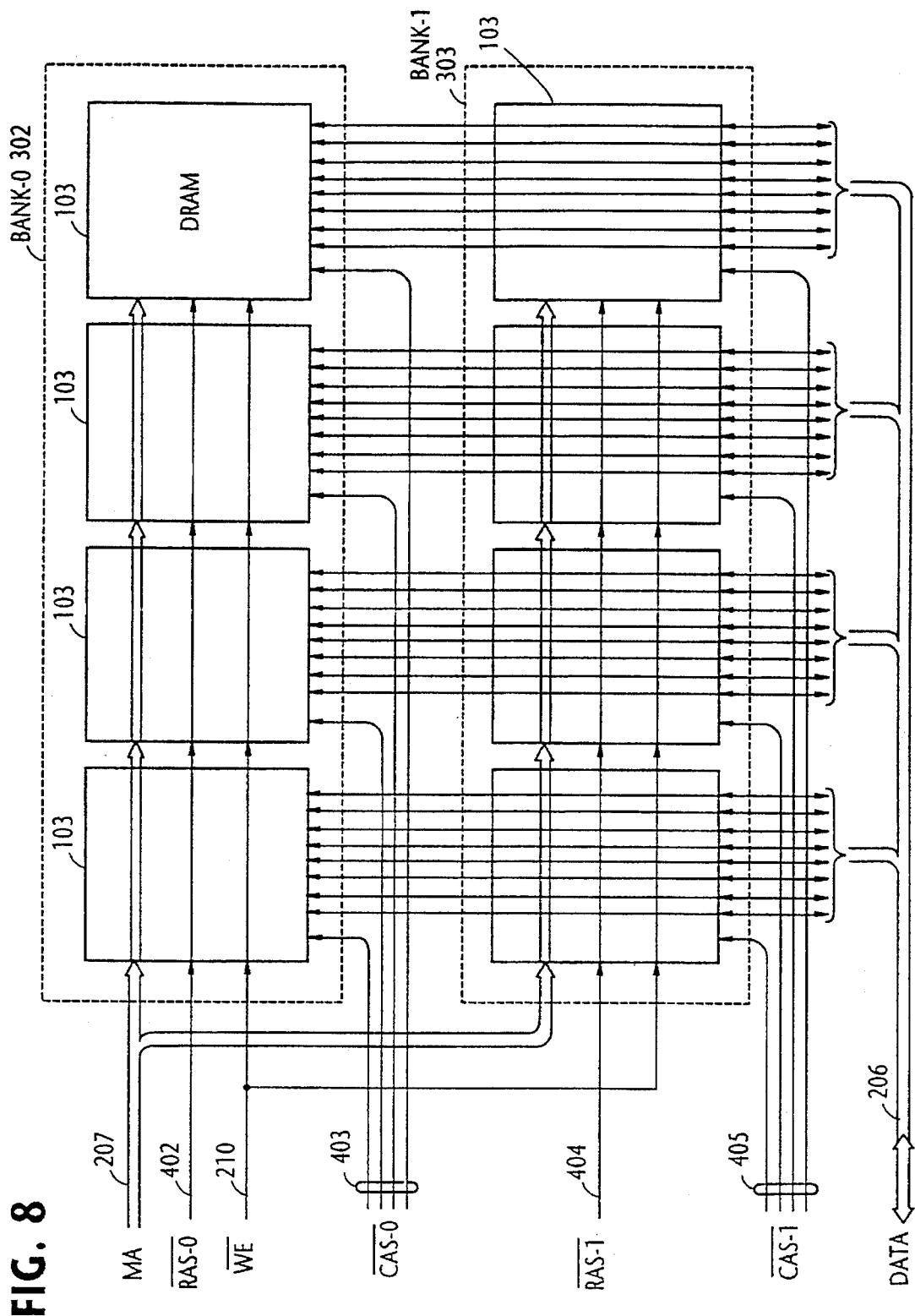
FIG. 8 is a block diagram of the DRAM module of FIG. 7.

Referring now to FIGS. 7 to 11, there is shown a circuit arrangement for a dynamic random access memory (DRAM) according to the present invention. As generally shown in FIG. 7, the circuit comprises a microprocessor 100 such as Intel's i80486, a DRAM controller 300 and a DRAM module 301 which is directly coupled by a 32-bit data bus 206 to the microprocessor 100. As illustrated in FIG. 8, the DRAM module 301 comprises a first bank 302 of four DRAM units 103 and a second bank 303 of four DRAM units 103. The data bus 206 (FIG. 9) is divided into four 8-bit groups corresponding respectively to the four DRAM units of each bank, and the eight bits of each group are connected to the 8-bit data input/output port of the corresponding DRAM unit 103 of each bank. A row address strobe line ( RAS-0) 402 is connected to the RAS port of the DRAM units 103 of the bank-0 memories 302 and a 4-bit column address strobe (CAS-0) bus 403 is divided into four 1-bit lines leading respectively to the corresponding ports of memory units 103 of the bank-0 302. Likewise, a row address strobe line (RAS-1) 404 is connected to the corresponding port of the memory units 103 of the bank-1 303 and a 4-bit column address strobe (CAS-1) bus 405 is divided into four 1-bit lines leading respectively to the corresponding ports of the bank-1 memories 303. A row/column address signal is applied on multiplexed address (MA) bus 207 to the address input A of all DRAM units 103 and a write enable WE is applied through line 210 to the WE input of all memory units.

Figure 9:
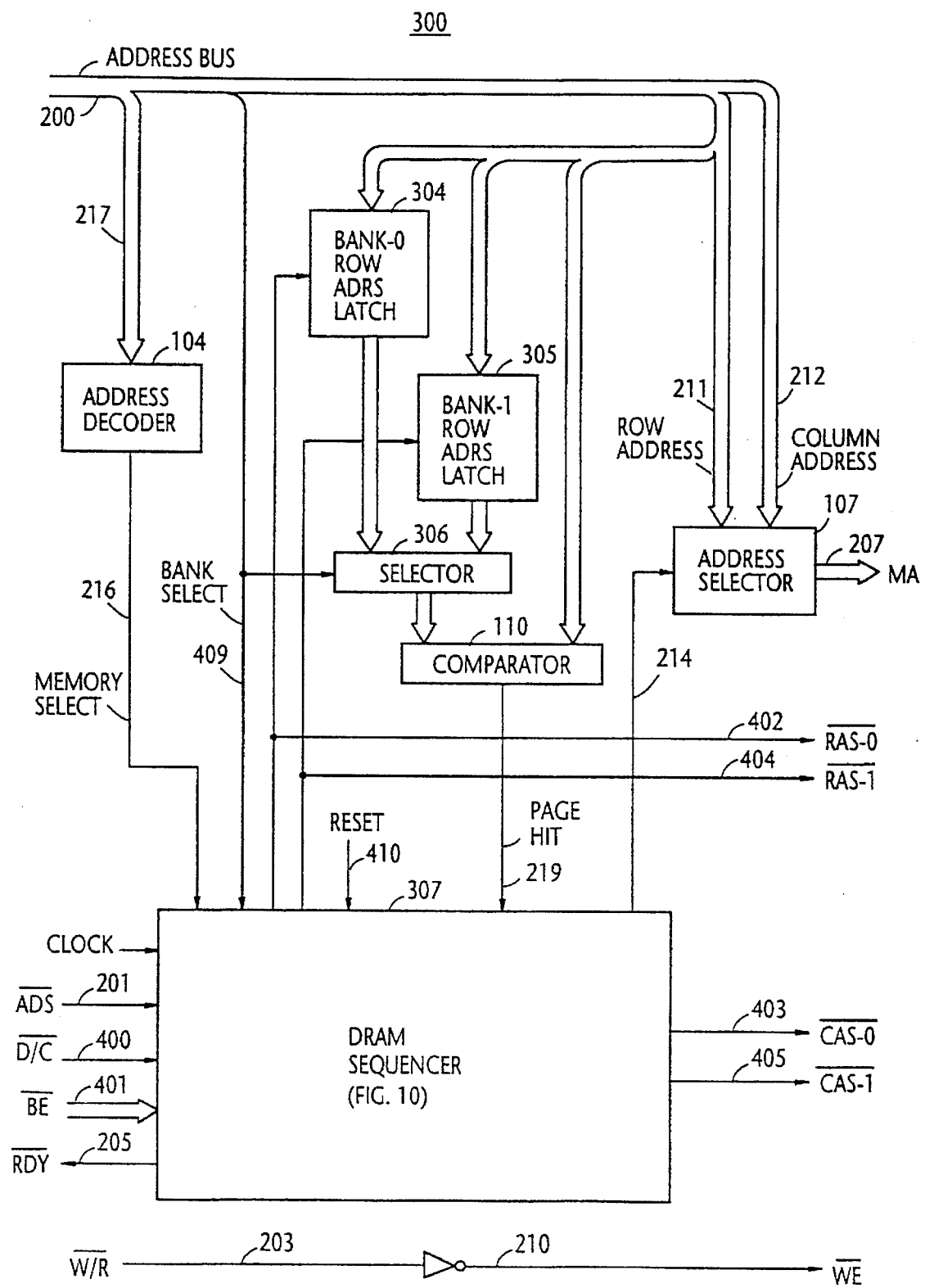
FIG. 9 is a block diagram of the DRAM controller of FIG. 7.

As shown in FIG. 9, the address bus 200 from microprocessor 100 is divided within the DRAM controller 300 into a memory select address bus 217, a 1-bit bank select line 409, a row address bus 211 and a column address bus 212. As is well known in the art, the dynamic RAM has the ability to buffer a row of bits inside the DRAM to allow repeated column accesses. The memory select bus 217 is connected to a memory select address decoder 104 to supply a logic-0 output through a memory select line 216 to a page management DRAM sequencer 307 if the DRAM unit 103 of the controller 300 is identified by a signal on the memory select bus 217. The 10-bit row address bus 211 is coupled to a first-bank row address latch 304, a second-bank row address latch 305, a row address comparator 110 and a memory address (MA) selector 107. One of the outputs of address latches 304 and 305 is selectively coupled through a page address selector 306 to the row address comparator 110 depending on the logic level of the bank select line 409 and compared with a signal on the row address on bus 211. The row address comparator 110 supplies a page hit signal on line 219 to the DRAM sequencer 307 when there is a match between the two address signals.

The DRAM sequencer 307 receives other input signals from the microprocessor 100 which include an address strobe. (ADS) signal on an ADS line 201 indicating the start timing of bus cycle, a data/code (D/C) indication signal on a D/C line 400, and a 4-bit byte enable (BE) signal on a BE bus 401 that identifies which byte to be accessed. The DRAM sequencer 307 operates in conjunction with the address selector 107 as a control means to control or direct access to the memory units.

Figure 10:
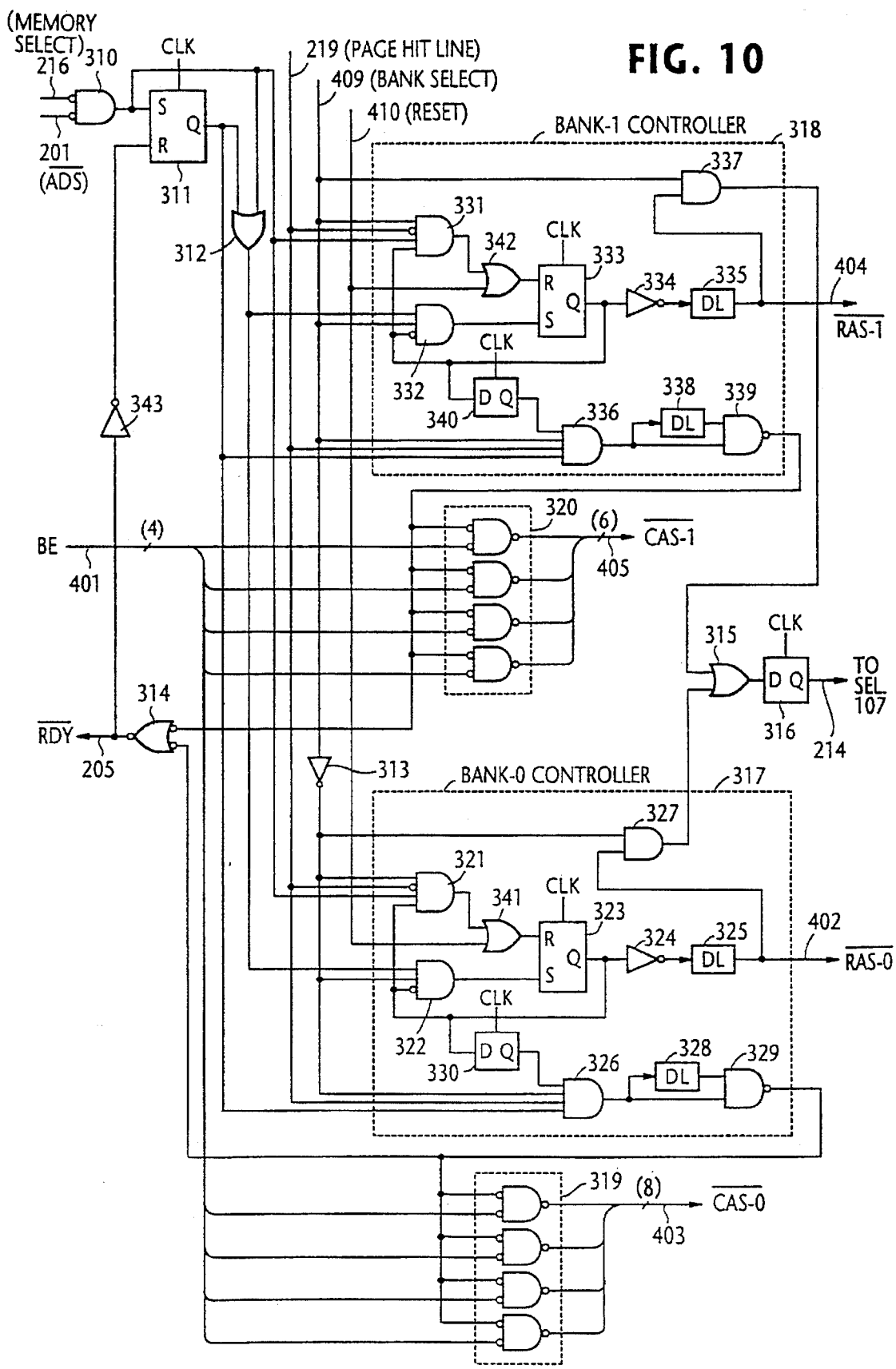
FIG. 10 is a circuit diagram showing details of the DRAM sequencer of FIG. 9.

As illustrated in FIG. 10, the DRAM sequencer 307 generally comprises a first-bank controller 317 and a second-bank controller 318 of identical circuit configuration. The output line 216 of address decoder 104 and the ADS line 201 of microprocessor 100 are connected to the negative inputs of an AND gate 310 whose output is coupled to the set input of a flip-flop 311, to one input of an OR gate 312, and to one input of an AND gate 321 of the first-bank controller 317 and further to one input of an AND gate 331 of the second-bank controller 318. The reset input of flip-flop 311 is taken from the output of a NOR gate 314 via an inverter 343, the Q output of flip-flop 311 is applied to AND gates 326 and 336 to which the page hit line 219 is also connected.

Via an inverter 313 the bank select line 409 is coupled to AND gates 321, 322, 326 and 327. The output of AND gate 321 is coupled via OR gate 341 to the reset input of a flip-flop 323, the output of which is coupled back to one input of AND gate 321 and the negative input of AND gate 322. The output of AND gate 322 is coupled to the set input of flip-flop 323. The output of flip-flop 323 is coupled via inverter 324 to a delay element 325 which leads to the row address strobe line $\overline{RAS-0}$ 402 and AND gate 327. The output of flip-flop 323 is further connected to a flip-flop 330 whose output is coupled to AND gate 326. The output of AND gate 326 is applied direct to one input of a NAND gate 329 and further applied to the other input of the NAND gate via a delay element 328. The output of NAND gate 329 is supplied to a bank of NAND gates 319 as well as to NOR gate 314. The outputs of NAND gates 319 are coupled to the 4-bit $\overline{CAS-0}$ bus 403.

In a similar manner, the bank select line 409 is directly coupled to AND gates 331, 332, 336 and 337. The output of AND gate 331 is coupled via OR gate 342 to the reset input of a flip-flop 333, the output of which is coupled back to one input of AND gate 331 and the negative input of AND gate 332. The output of AND gate 332 is coupled to the set input of flip-flop 333. The output of flip-flop 333 is coupled via inverter 334 to a delay element 335 which leads to the $\overline{RAS-1}$ line 404 and AND gate 337. The output of flip-flop 333 is further connected to a flip-flop 340 whose output is coupled to AND gate 336. The output of AND gate 336 is applied directly to one input of a NAND gate 339 and further applied to the other input of the NAND gate via a delay element 338. The output of NAND gate 339 is supplied to a bank of NAND gates 320 as well as to NOR gate 314. The outputs of NAND gates 320 are coupled to the 4-bit $\overline{CAS-1}$ bus 405 for bank-1 DRAM.

The outputs of AND gates 327 and 337 are combined through an OR gate 315 to a flip-flop 316 whose output leads to the control line 214 of selector 107. The byte enable signals supplied from microprocessor 100 on the BE bus 403 are coupled to NAND gates 319 and 320. A reset signal is supplied through line 410 to the OR gates 341 and 342.

Figure 11:
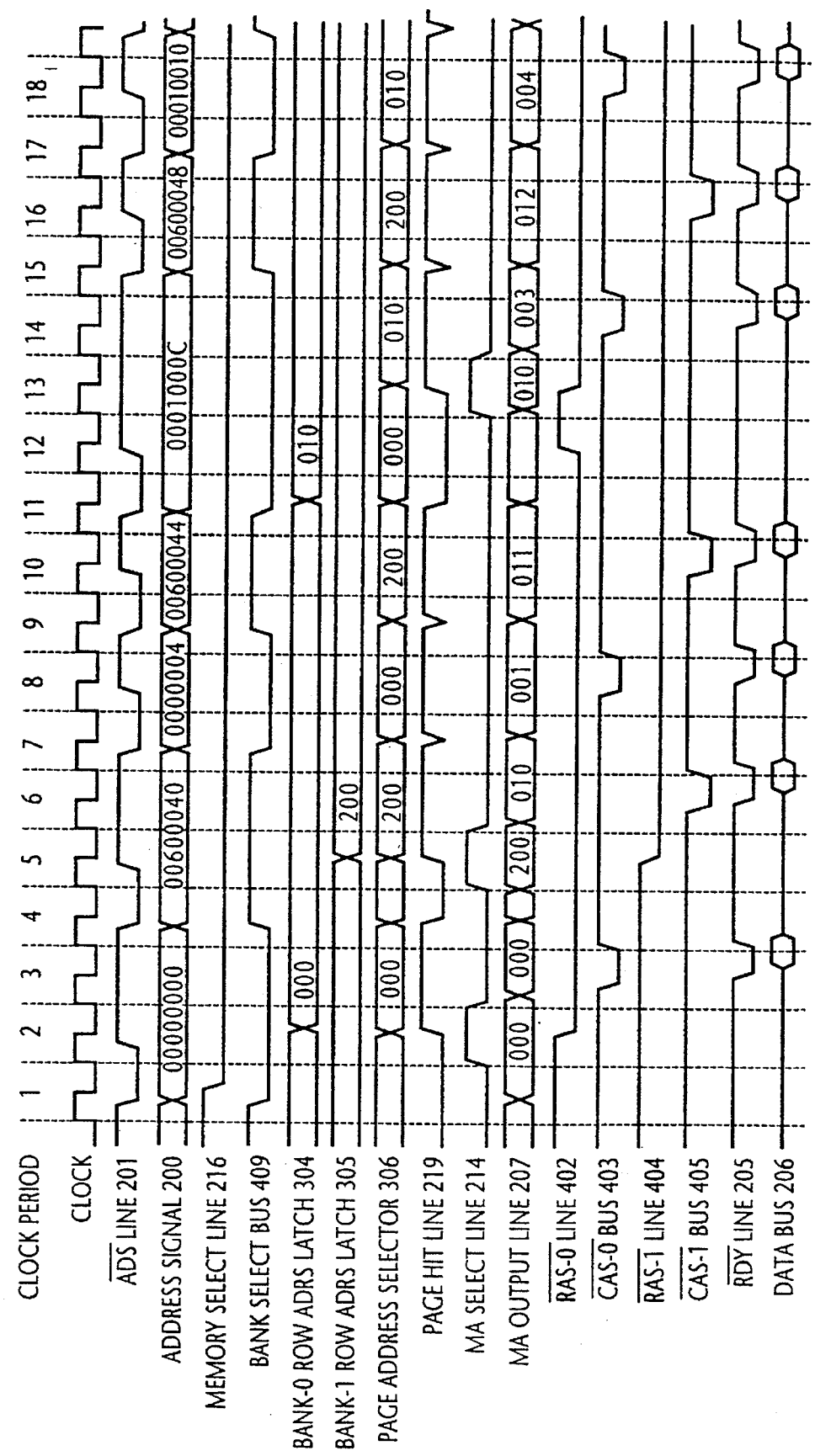
FIG. 11 is a timing diagram associated with FIGS. 9 and 10.

A read operation of the DRAM sequencer 307 will be described below with reference to the timing diagram of FIG. 11. When the reset line 410 is activated, the outputs of flip-flops 323 and 333 of both controllers 317 and 318 change states from a high to a low level, setting the row address strobe lines 402 and 404 to a high level, and causing one of the AND gates 327 and 337 to go high depending on the logic level of the bank select line 409. As a result, the flip-flop 316 changes states in response to the leading edge of a subsequent clock pulse, producing a high level output on the select line 214 that leads to the selector 107 (FIG. 9), so that a row address is selected and applied to the MA line 207.

Assume that a first data read operation occurs for accessing the bank-0 memories 302 during clock periods 1 to 3.

Specifically, during period 1, the microprocessor 100 low-activates the $\overline{ADS}$ line 201 and produces a hexadecimal address code "00000000" on the address bus 200. In response, the memory address decoder 104 decodes the memory select address part of the address code and activates a low level on the output line 216. At the same time, the bank select line 409 (FIGS. 9 and 10) is also activated at a low level by the microprocessor 100 for pre-conditioning the AND gates 321, 322 and 326 of bank-0 controller 317 via inverter 313, while activating its AND gate 327 to cause latch 316 to produce a high-level output on the MA select line 214 at the start timing of period 2. With the lines 201 and 216 being set to low level, the output of AND gate 310 goes high, causing the flip-flop 311 to change to a high output state.

In response to the high level output of flip-flop 311, the AND gate 322 of bank-0 controller 317 goes high, allowing the flip-flop 323 to go high at the start timing of period 2. The output of inverter 324 switches to low and this low level is transmitted to the row-activate $\overline{RAS-0}$ line 402 following a delay introduced by delay element 325, so that the row address strobe is supplied to the bank-0 memories after the setup time of the module. The bank-0 row address latch 304 is thus enabled (FIG. 9) to store a row address code "000" from microprocessor 100. This address code is supplied through the page address selector 306 to the row address comparator 110. During the second half section of period 2, a match occurs between the stored row address and the one supplied on the row address bus 211, and comparator 110 activates a high level on the page hit line 219.

With the row-activate $\overline{RAS-0}$ line 402 being set to low, the AND gate 327 of bank-0 controller 317 produces a low-level output, which causes flip-flop 316 to change to a low output state, thus activating a low level on the MA select line 214 at the start of period 3. A column address code "000" on bus 212 is therefore selected by selector 107 and supplied to the bank-0 memories 302 through the MA output line 207. With the output of flip-flop 323 being set during period 2, flip-flop 330 switches to a high output state at the start of period 3. As a result, AND gate 326 produces a high-level output which is applied through delay element 328 to NAND gate 329, so that it supplies a signal to the NAND-gate bank 319 to pass a byte enable (BE) pulse from microprocessor 100 on the $\overline{CAS-0}$ bus 403 to the bank-0 memories following the setup time of the bank-0 DRAM. With the output of NAND gate 329 being set to low, the ready line $\overline{RDY}$ 205 is made active low during the second half section of period 3, informing the microprocessor 100 of the end of the first RAS-CAS bus cycle. As a result, a data read operation from the address "00000000" of the bank-0 memories is terminated and a row address code "000" is stored in the bank-0 latch 304.

During periods 4 to 6, a second data read operation is performed on the bank-1 memories 303 by setting the bank select line 409 to high so that the bank-1 controller 318 and NAND bank 320 operate in a manner similar to the first data read operation provided by the bank-0 controller 317 and NAND bank 319 during periods 1 to 3.

More specifically, during period 4, the microprocessor 100 activates a low level on the $\overline{ADS}$ line 201 and produces a hexadecimal address code "00600040" on the address bus 200. At the same time, the bank select line 409 is also activated at a high level by the microprocessor 100 for pre-conditioning the AND gates 331, 332 and 336 of bank-1 controller 318, while activating its AND gate 337 to cause latch 316 to produce a high-level output on the MA select line 214 at the start timing of period 5. With the lines 201 and 216 being set to low level, the output of AND gate 310 goes high, causing the flip-flop 311 to change to high output state.

In response to the high level output of flip-flop 311, the AND gate 332 goes high, allowing the flip-flop 333 to go high at the start timing of period 5. The output of inverter 344 switches to low and this low level condition is transmitted to the row address strobe line 404 following a delay introduced by delay element 335, so that the row address strobe is supplied to the bank-1 memories 303 after the setup time of the module. The bank-1 row address latch 305 is thus enabled to store a row address code "200" from microprocessor 100. This address code is supplied through the page address selector 306 to the row address comparator 110. During the second half section of period 5, a match occurs between the stored row address and the one supplied on the row address bus 211, and comparator 110 activates a high level on the page hit line 219.

With the row address strobe line 404 being set to low, the AND gate 337 produces a low-level output, which causes flip-flop 316 to change to a low output state, thus activating a low level on the MA select line 214 at the start timing of period 6. A column address code "010" on bus 212 is selected by selector 107 and supplied to the bank-1 module 303 through the MA output line 207. With the output of flip-flop 333 being set during period 5, flip-flop 340 switches to a high output state at the start of period 6. As a result, AND gate 336 produces a high-level output which is applied through delay element 338 to NAND gate 339, so that it supplies a signal to the NAND-gate bank 320 to pass a byte enable (BE) pulse from microprocessor 100 on the $\overline{CAS-1}$ line 405 to the bank-1 memories 303, following the setup time of the bank-1 memories. With the output of NAND gate 339 being set to low, the ready line $\overline{RDY}$ 205 is made active low during the second half section of period 6, informing the microprocessor 100 of the end of the second RAS-CAS bus cycle. As a result, a data read operation from the address "00600040" of the bank-1 memories is terminated and a row address code "200" is stored in the bank-1 latch 305 during period 6.

With the row address codes "000" and "200" being stored in the bank-0 latch 304 and the bank-1 latch 305, respectively, if the microprocessor 100 attempts a third data read operation during period 7 by accessing an address "00000004" of the bank-0 memories using the row address code "000" and a column address code "001", the page hit line 219 is quickly set to high level immediately following the low-setting of the address strobe line 201. Flip-flop 311 is switched to high level at the start of period 8. With the bank select line 409 being set to low, AND gate 326 produces an output, causing the $\overline{CAS-0}$ line 403 to produce a active low during period 8. With the MA select line 214 still being set to low, the column address "001" is applied to the bank-0 memories during period 8. In a similar manner, if the microprocessor 100 attempts a fourth data read operation during period 9 by accessing an address "00600044" of the bank-1 memories using the row address code "200" and a column address code "011", the page hit line 219 is quickly set to high level immediately following the low-setting of the address strobe line 201 by microprocessor 100. Flip-flop 311 is switched to high output state at the start of period 10. With the bank select line 409 being set to high, AND gate 336 produces an output, causing the $\overline{CAS-1}$ line 405 to produce a active low pulse during period 10. With the MA select line 214 being still set to low, the column address "011" is sent to the bank-1 memories during period 10.

With the row address codes "000" and "200" still being stored in the bank-0 latch 304 and the bank-1 latch 305, respectively, assume that the microprocessor 100 attempts a fifth read operation during period 11 by accessing an address "0001000C" of the bank-0 memories using the row address code "010" and a column address code "003". A page miss occurs immediately following the low-level setting of the address strobe line 201, setting the page hit line 219 to low.

Thus, a new bus cycle begins by setting the AND gate 310 to high, and AND gate 321 is conditioned to reset the flip-flop 323 at the start of period 12 and the $\overline{RAS-0}$ line 402 is set to inactive high state. At the start of period 13, flip-flop 316 is switched to high level for coupling the new row address code "010" to the bank-0 memories through the MA output line 207, while storing it into the bank-0 row address latch 304. As a result, a page hit occurs at the midpoint of period 13, setting the page hit line 219 to high to cause the $\overline{CAS-0}$ line 403 to produce a low-level pulse during period 14.

If the microprocessor 100 accesses an address "0060048" of the bank-1 memories during period 15, using the row address code "200" and a column address code "012", a page hit occurs quickly and the $\overline{CAS-1}$ line 405 is set to the active low state during period 16. In like manner, if the microprocessor 100 accesses an address "00010010" of the bank-0 memories during period 17, using the row address code "010" and a column address code "004", a page hit occurs quickly and the $\overline{CAS-0}$ line 403 is set to the active low state during period 18.

It is seen from the foregoing description that since active row address values are stored respectively for different banks of memories, there is a less likelihood of the occurrences of a page miss even if access to the memories changes frequently from one bank to another, so that the average access time can be reduced.

What is claimed is:

1. A memory controller for a computer system having a processor and a plurality of groups of memories each being capable of buffering a row address, wherein one group of memories of said groups of memories is selected by said processor, said memory controller comprising:

a plurality of latch means corresponding respectively to said groups of memories, each of the latch means storing a row address from said processor when the corresponding group of memories is selected by said processor;

selector means for selecting one of said latch means corresponding to the group of memories which is currently selected by said processor;

a comparator for comparing the row address stored in the selected latch means with a row address from said processor to detect a coincidence or a noncoincidence therebetween; and control means responsive to an initial coincidence detected by said comparator for directing access to the group of memories currently selected using the first row address, said control means being responsive to a subsequent coincidence detected by said comparator when the first row address is stored in the selected latch means for directing access to the memories of the currently selected group using the same first row address and one of a plurality of column addresses from said processor, and said control means being responsive to a noncoincidence detected by said comparator when the first row address is stored in the selected latch means for directing access to the memories of the currently selected group using a second row address and one of said column addresses from said processor.

2. A memory controller as in claim 1, wherein said control means includes an address selector for outputting an address signal to said groups of memories.

3. A memory controller as in claim 2, wherein said control means comprises a plurality of memory bank controllers, each connected to an OR gate, and a flip-flop connected to said OR gate, wherein said flip-flop outputs a control signal for controlling said address selector.

4. A memory controller as in claim 3, wherein each of said memory bank controllers outputs a row address strobe (RAS) signal to a corresponding group of memories of said group of memories.

5. A memory controller for a computer system having a processor and a plurality of groups of dynamic random access memories (DRAMs), wherein one group of DRAMs of said groups of DRAMs is selected by said processor, and the selected group of DRAMs is row-accessed by activating a row address strobe (RAS) line of that group and each memory of the row-accessed group is column-accessed by activating a column address strobe (CAS) line of that memory, said memory controller comprising:

a plurality of latch means corresponding respectively to said groups of DRAMs, each of the latch means storing a row address from said processor when the corresponding group of DRAMs is selected by said processor;

selector means for selecting one of said latch means corresponding to the group of DRAMs which is currently selected by said processor;

a comparator for comparing the row address stored in the selected latch means with a row address from said processor to detect a coincidence or a noncoincidence therebetween; and control means responsive to an initial coincidence detected by said comparator when the first row address is stored in the selected latch means for activating a RAS line of the currently selected group of DRAMs and a CAS line of one of the DRAMs of the currently selected group and for supplying the first row address and one of a plurality of column addresses to said DRAMs, said control means being responsive to a subsequent coincidence detected by said comparator when the first row address is stored in the selected latch means for activating the CAS line of one of the DRAMs of the currently selected group and supplying one of said column addresses from said processor to said DRAMs, and directing access to the memories of the currently selected group using the same first row address and one of a plurality of column addresses from said processor, and said control means being responsive to a noncoincidence detected by said comparator when the first row address is stored in the selected latch means for inactivating and then activating the RAS line of the currently selected group, activating the CAS line of one of the DRAMs of the currently selected group, and supplying a second row address and one of said column addresses from said processor to said DRAMs.

6. A memory controller as in claim 5, wherein said control means includes an address selector for outputting an address signal to said groups of DRAMs.

7. A memory controller as in claim 6, wherein said control means comprises a plurality of memory bank controllers, each connected to an OR gate, and a flip-flop connected to said OR gate, wherein said flip-flop outputs a control signal for controlling said address selector.

8. A memory controller as in claim 8, wherein each of said memory bank outputs a row address strobe (RAS) signal to a corresponding group of DRAMs of said group of DRAMs.

* * * * *